(12) United States Patent
Gorokhovsky (10) Patent No.: US 6,871,700 B2
(45) Date of Patent: Mar. 29, 2005

(54) THERMAL FLUX REGULATOR (75) Inventor: Valdimir Gorokhovsky, Toronto (CA)

(73) Assignee: G & H Technologies LLC, Florence, MT (US)

( * ) Notice: Subject to any disclaimer, the term of this patent is extended or adjusted under 35 U.S.C. 154(b) by 261 days.

(21) Appl. No.: 09/847,353

(22) Filed: May 3, 2001

(65) Prior Publication Data
US 2002/0059905 A1 May 23, 2002

Related U.S. Application Data (63) Continuation-in-part of application No. 09/714,265, filed on Nov. 17, 2000, now Pat. No. 6,684,759.

(51) Int. Cl.[7] .............................................. F28D 15/00
(52) U.S. Cl. ........................... 165/104.13; 165/104.15; 165/10; 422/198
(58) Field of Search ..................... 165/201, 10, 104.11, 165/104.13, 104.15, 80.1, 80.2; 42/198

(56) References Cited

U.S. PATENT DOCUMENTS

| | | | |
|---|---|---|---|
| 3,985,513 A | 10/1976 | Silaev et al. ................ | 29/182.5 |
| 4,096,024 A * | 6/1978 | Dusserre et al. | |
| 4,272,355 A | 6/1981 | Kennedy ....................... | 204/298 |
| 4,343,651 A | 8/1982 | Yazu et al. ................... | 75/238 |
| 4,589,917 A | 5/1986 | Nagato ......................... | 75/238 |
| 4,723,420 A * | 2/1988 | Sitte | |
| 4,811,687 A | 3/1989 | Prince ......................... | 118/666 |
| 4,911,756 A | 3/1990 | Nakai et al. .................. | 75/238 |
| 4,983,212 A | 1/1991 | Iyori et al. .................... | 75/238 |
| 5,037,624 A * | 8/1991 | Tom et al. | |
| 5,051,231 A | 9/1991 | Imai et al. .................... | 419/13 |
| 5,303,617 A | 4/1994 | Asada et al. .................. | 75/231 |
| 5,387,881 A * | 2/1995 | Schweda et al. | |
| 5,614,684 A | 3/1997 | Lim et al. ...................... | 75/236 |
| 5,643,485 A | 7/1997 | Potter et al. ................ | 219/621 |
| 5,682,589 A | 10/1997 | Casey et al. .................. | 419/13 |
| 5,766,365 A | 6/1998 | Umotoy et al. .............. | 118/728 |
| 5,820,686 A | 10/1998 | Moore ......................... | 118/730 |
| 5,925,197 A | 7/1999 | Galli .......................... | 148/409 |
| 5,948,495 A | 9/1999 | Stanish et al. ............. | 428/64.1 |
| 6,375,739 B1 * | 4/2002 | Mullins | |

FOREIGN PATENT DOCUMENTS

| | | | |
|---|---|---|---|
| EP | 0 520 465 A1 | 6/1992 | ........... C22C/29/16 |
| GB | 1439315 | 5/1977 | ........... C22C/27/06 |
| GB | G 2 083 500 | 8/1981 | ............. C22C/9/00 |
| GB | 2 283 496 | 5/1995 | ........... C22C/21/12 |
| GB | 2 318 803 | 5/1998 | ........... C22C/29/02 |
| GB | 2 325 929 | 12/1998 | ......... C07C/211/55 |
| GB | 2 325 939 | 12/1998 | ........... C23C/14/50 |
| GB | 2 341 395 | 3/2000 | ........... C22C/32/00 |
| WO | WO 93/16830 | 9/1993 | ............. B22F/1/02 |

* cited by examiner

Primary Examiner—Ljiljana Ciric
(74) Attorney, Agent, or Firm—Gowling Lafleur Henderson LLP; Peter Milne (57) ABSTRACT A heat transfer regulating mixture having a metallic component A with a melting point $T_A$ and a particulate ceramic component B which is non-wettable by the metallic component A, non-reactive therewith and which has a melting temperature $T_B$ which is higher than both the temperature $T_A$ and a desired operating temperature $T_D$ which is also higher than $T_A$. The metallic component A and the particulate ceramic component B and the respective amounts will typically be selected to have a higher thermal resistivity below $T_A$ than above $T_A$. The heat transfer regulating mixture may be incorporated in a thermal flux regulator having the mixture within an enclosure surrounding a heat generating reactor structure.

12 Claims, 10 Drawing Sheets

THERMAL FLUX REGULATOR

This application is a continuation-in-part of U.S. patent application Ser. No.: 09/714,265, filed Nov. 17, 2000, now U.S. Pat. No. 6,684,759.

FIELD OF INVENTION

This invention is related to apparatus and methods for regulating heat flux between a heat source and a heat sink

BACKGROUND OF THE INVENTION

Chemical and physical vapour deposition processes developed in the last few decades can produce high purity substances in commercial quantities. One of the more significant of such processes is, for example, the production of diamonds, usually in the polycrystalline state, utilizing a plasma source. The production of diamonds by vapour deposition is accompanied by high thermal energy transfer. Should the heat transfer and substrate temperature regulation be inadequate, the crystallization and rate of growth of the deposit obtained, in particular, the uniform quality of the deposited diamond cannot be maintained. In other words, the temperature regulation and control of the substrate is a critical feature in both a physical or a chemical vapour deposition (CVD) process. A frequently implemented method of substrate temperature control is regulating the heat loss of the substrate support or substrate mount means. Regulated heat loss of the substrate support or substrate mount is usually effected by conducting heat away in a controlled manner by some medium in contact with the substrate mount, as well as by regulating the heat removed by a heat sink. In U.S. Pat. No. 5,527,392, issued to Snail et al. on Jun. 28, 1996, a device for controlling the temperature of the substrate mount in a CVD reactor is described. A mixture of gases having such composition as to yield a desired mean thermal conductivity, is fed to the device, to flow at known flow rates about and around the substrate mount located in a housing. In addition, the geometry and the material of which the substrate mount is made of, are selected to provide further control of the heat transfer capability of the substrate mount. The housing acts as the heat sink, and has means for a cooling fluid as well. One of the difficulties with the above arrangement is that large and cumbersome gas tanks need to be installed to provide steady and reliable gas flows, as the heat control system is very sensitive to changes in the gas composition.

The metallurgical industries have been using sand or similar inert particles and air circulating between the particles in a vat or in a pile, for surrounding a large metal body which has been previously heated to a very high temperature, or for encasing a casting, to provide a particulate medium for controlled or slow cooling of the metal body or cast. There are known heat transfer methods utilizing multi-phase systems in other industries. For example, U.S. Pat. No. 5,170,930, issued to T. P. Dolbear et al. on Dec. 15, 1992, describes a liquid metal paste for utilization in fast cooling of electronic components and solid state chips. The semi-solid paste is made up of low melting metals and alloys, and solid particles of higher melting point materials, or in some instances, ceramic particles. The paste is required to have high viscosity, be both electrically and thermally conductive at temperatures close to room temperature, and have additional characteristics specified useful in the electronics industry. It is noted that the primary function of the metal paste is to conduct heat away fast, and not to regulate the temperature of the electronic component at a certain level. Another multi-phase composition for fast cooling is described in U.S. Pat. No. 5,604,037, issued to J.-M. Ting et al. on Feb. 18, 1997. The multi-phase composition comprises a diamond/carbon/carbon fibre composite coated with a metallic layer for use as a dielectric heat sink in electronic systems.

In the above multi-phased cooling devices utilized by the electronics and metallurgical industries heat is removed, but no importance is attached to maintaining the temperature of the system under consideration at a prerequisite level. There is a need for regulating the temperature of a substrate or the surface temperature of a substrate engaged in an exothermic reaction yielding a deposit, by regulating the heat loss by means of controlled heat transfer.

SUMMARY OF THE INVENTION

A heat transfer regulating mixture having a metallic component A with a melting point $T_A$ and a particulate ceramic component B which is non-wettable by the metallic component A, non-reactive therewith and which has a melting temperature $T_B$ which is higher than both the temperature $T_A$ and a desired operating temperature $T_D$ which is also higher than $T_A$. The metallic component A and the particulate ceramic component B and the respective amounts will typically be selected to have a higher thermal resistivity above $T_A$ than below $T_A$.

The metallic component A may be aluminum, tin, lead, gallium, indium, copper, silver and alloys thereof.

The particulate ceramic component B may be of alumina, titanium nitride, titanium carbide, titanium carbonitride, boron nitride, boron carbide, silicon carbide, silica and mixtures thereof.

The particulate component B may have an average particle size from 1 $\mu$m to 150 $\mu$m.

The heat transfer regulating mixture may be incorporated in the heat transfer regulating device having the mixture within an enclosure A method as provided for controlling the flow of heat flux between a heat source and a heat sink comprising the steps of:

Providing a first thermal regulator between the heat source and the heat sink which varies between a higher and a lower thermal conductivity at a first pre-determined temperature; and, Providing a second thermal regulator between the first thermal regulator and the heat sink which varies between a higher thermal conductivity and a lower thermal conductivity at a second pre-determined temperature lower than the first pre-determined temperature.

The first thermal regulator may be a mixture of a first ceramic powder having a melting point above the first predetermined temperature and above a temperature of the heat source and a first metal powder which is non-wetting of the first ceramic powder and which has a melting point at the first pre-determined temperature. The ceramic powder may be present in an amount sufficient to fill the first thermal regulator to avoid segregation of the first ceramic and metal powders upon melting of the first metal powder.

The method may include the further step of applying pressure to the first ceramic powder to vary its thermal conductivity.

The mixture of the first and second ceramic and metal powders may be in a gaseous environment having a predetermined gas pressure.

The second thermal regulator may incorporate a liquid, gaseous, vacuum or solid thermal transfer medium. The solid thermal transfer medium may be a powder, multiple thin sheets, foam or fiber. It can also consist of ribs or fins. The second thermal regulator may be a mixture of a second ceramic powder having a melting point above the second predetermined temperature and above a predetermined operating temperature and a second metal powder which is non-wetting of the second ceramic powder. The second ceramic powder may be present in an amount sufficient to fill the second thermal regulator to avoid segregation of the second ceramic and second metal powders upon melting of the second metal powder.

The method may further include the step of applying pressure to the second ceramic powder to vary its thermal conductivity.

The mixture of the second ceramic and metal powders may be in a gaseous environment having a predetermined gas pressure.

A heat transfer regulator is provided for a heated reactor. The regulator has a reactor chamber for housing the reactor and a first heat regulating chamber surrounding the reactor chamber. The first heat regulating chamber contains a first heat transfer regulating mixture having a metallic component A having a melting point $T_A$ and a particular component B which is non-wettable by the metallic component A, non-reactive therewith and has a melting temperature $T_D$ which is higher than both the temperature $T_A$ and a first desired operating temperature $T_D$, which is also higher than $T_A$.

BRIEF DESCRIPTION OF THE DRAWINGS

Preferred embodiments of the present invention are:

FIG. 11 is an axial sectional schematic representation illustrating the use of a thermal regulating compound according to the present invention as a thermal regulating and support medium in a sliding bearing arrangement for supporting rotating parts exposed in a thermal transfer environment; and, FIG. 12a is a schematic cross-sectional view

The preferred embodiments of the invention illustrated by examples will be described below.

DETAILED DESCRIPTION OF THE PREFERRED EMBODIMENTS

The formation of a vapour deposited layer of a substance on a substrate is usually accompanied by the generation of substantial amounts of heat. The generated heat needs to be removed, preferably at a controlled rate. If the heat generated is not removed in a controlled and regulated manner the vapour deposited layer can exhibit irregular morphology, internal stresses and uneven thickness, the substrate may develop cracks, or/and irregularities of similar nature may be encountered. One method of having a controlled heat transfer is to encase or surround the substrate, including a substrate mount, in a medium which has a heat transfer coefficient $\lambda$, selected for the specific conditions of the vapour deposition process. In the instance of a multi-component system providing a heat energy removal means, the heat transfer coefficient $\lambda$ can be computed as a mean value of the heat transfer coefficient of each component. It is to be noted, however, that the mean heat transfer coefficient derived for a specific set of conditions of a vapour deposition process, cannot adapt itself to unforeseen and unexpected changes in the variables of the deposition process, or in other words, it does not usually provide automatic regulation of the temperature of the substrate. For the sake of clarity, definition of what is understood by some of the terminology used in the discussion of the preferred embodiment of the present invention is provided below.

"Substrate" is understood to mean a three dimensional body providing the surface on which the vapour species is deposited. Usually but not necessarily, only a portion of the surface, most frequently the surface in the proximity of one end of the substrate body, is utilized as the depositing surface, and the other end of the body of the substrate is attached to or is supported by, a substrate mount or holder. It is preferred that the depositing surface of the substrate has close to uniform temperature, while the rest of the substrate body is in a temperature gradient.

"Plasma" is considered to mean an atmosphere of low pressure and high temperature, containing ionized gaseous species. Not all the gases in the plasma are ionized, but it is usual that the species to be deposited is ionized. The components of a plasma often include argon or similar inert gases, both in the atomic state and in an ionized state. Other gases which may be utilized in a plasma are nitrogen, methane, oxygen, water, vaporized metal, short chained hydrocarbons, and similar gases which can take part in forming an element or a compound which is to be deposited. The plasma utilized in diamond or diamond-like coating deposition usually contains ionized methane gas.

"Heat sink" is commonly understood to mean a body or a series of bodies which remove heat predominantly by means of heat conduction or heat energy flow. A heat sink may be composed of several stages, each representing a certain thermal resistance manifested by a temperature gradient. A typical example of a heat sink stage is a metal body having water at ambient temperature circulated therethrough, in contact with another body at a higher temperature.

It has now been found that if a two-phase mixture is provided composed of a relatively low melting alloy or metal and a particulate ceramic material which conducts heat relatively well, an auto-regulating heat transfer system can be obtained. Since the thermal conductivity of gases is very low, generally about three orders of magnitude lower than solids, the effective thermal conductivity of the powder is determined mostly by the thermal properties of the bulk powder material and the effective contact area between neighbouring particles. In the case of a two-component metal-ceramic powder mixture, the effective contact area can be increased by applying pressure to the powder. The effective contact area increases dramatically when the metal component is melted and returns to the initial value when the temperature decreases and metal component solidifies, if the ceramic component is non-wettable by the metallic component. Accordingly the value of effective thermal conductivity of such a two-component mixture, increases significantly when the temperature exceeds the melting point of the metal component and decreases when the temperature of the mixture drops below melting point of the metal component.

To obtain a satisfactory auto-regulating heat transfer system the metal or alloy should have a melting point preferably 200–800° C. below the desired temperature of the depositing surface of the substrate, that is the temperature of the vapour deposition process, $T_D$. For obvious reasons, the melting temperature of the particulate ceramic material is usually substantially in excess of the temperature of the substrate. The selection of the ceramic material as a component of the two-phase mixture is governed by the process parameters. In other words, the melting point of metal or alloy forming the two-phase mixture in contact with the substrate is lower than the temperature at which the deposit is obtained, which is considerably lower than the melting temperature of the particulate ceramic. In general terms, if the mixture is made up of component A and component B, having melting temperatures $T_A$ and $T_B$, respectively, then for best results, the relationship $T_A<T_D<T_B$ has to hold. It is, however preferred, that the molten component A does not wet the particulate component B.

Figure 1A:
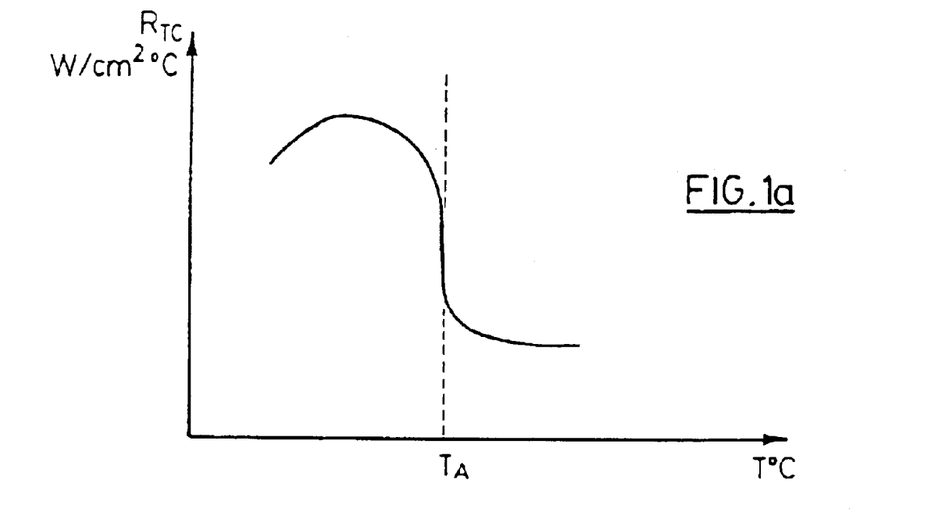
FIG. 1a is a graphical representation of the influence of the melting point of a lower melting component A on the heat transferred from the substrate.
Figure 1B:
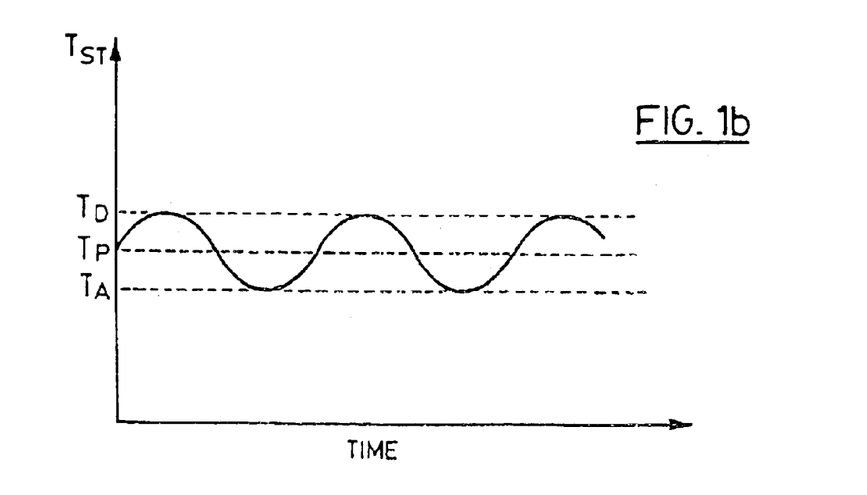
FIG. 1b shows the mean temperature of the substrate oscillating between a depositing temperature and the melting point of the lower melting component A.

In the instance of depositing a microcrystalline layer of diamonds on a particular substrate the selected substrate depositing temperature $T_D$ is around 900° C. The substrate is in contact or is encased, except for the depositing surface, by a mixture of a metal or alloy having melting point between 200° C. and 700° C., and ceramic particles, such as alumina, TiN, $SiO_2$ in the form of sand or quartz, or a mixture of these substances. Other ceramic particles which may be suitable as a component of the two-phase mixture of the present invention include boron nitride, boron carbide, silicon carbide, titanium carbide, high melting carbonitrides and oxynitrides, or chemical equivalents, and mixtures of such. The metal-ceramic particle mixture provides a semi-solid paste, or a highly viscous liquid bearing suspended solid particles, when in contact with the substrate at the temperature of the vapour deposition process, such as deposition of diamonds. When the heat is removed too fast, or the substrate temperature drops below the desired temperature, the two-component mixture freezes or solidifies, leading to poor or uneven contact between the mixture and the substrate. The effect on the heat removed, of the melting temperature of the lower melting component in the two-phase mixture in the neighbourhood of its melting point, is shown schematically in FIG. 1a, where $R_{TC}$ is the thermal contact resistance of the two component mixture, expressed as watts per $cm^2$ (w/$cm^2$), and $T_A$ is the melting point of the lower melting component, usually a metal. It can be seen that the thermal resistance has a low value when the mixture in thermal contact with the substrate, is composed of a liquid metal and a suspension of ceramic particles, resulting in high heat flux. The high heat flux lowers the temperature of the substrate in contact with the mixture, leading to the freezing of the mixture, thus severing contact between the mixture and the substrate, thereby increasing the thermal resistance and lowering the value of heat flux, or the rate of heat transfer per unit area. Lower heat flux or lower rate of heat transfer from the substrate results in an increase in the substrate temperature, which in turn, leads to the remelting of the two-component mixture and to the restoration of heat removal rate to the previous level. Thus the heat flux from the substrate, and hence the substrate temperature ($T_{st}$), will oscillate around an average value $T_p$, between the depositing temperature $T_D$ and the melting point $T_A$, of the metallic component of the two-phase mixture, as shown schematically in FIG. 1b, and can be described by the inequality $T_A<T_P<T_D$.

In the preferred embodiment of the invention, the substrate has a portion of its surface pre-treated to be able to receive the vapour deposited species. The pre-treatment usually includes mechanical and conventional cleaning process steps, and other known treatments to render the substrate surface receptive of the deposited species. The substrate is usually mounted in a substrate holder or mount, supported on a base or housing, which is immersed in an atmosphere containing the vapour to be deposited. As discussed above, the substrate is encased or is surrounded below the pre-treated portion of the surface, by a physical mixture of a low melting point metal or alloy and small sized particles of a ceramic material. The base supporting the substrate is usually made of metal, which represents the first stage of a conventional heat sink. Depending on the dimensions and on the nature of the base, the first stage of the heat sink has a certain thermal resistance, $R_1$. In the most simple case, the heat sink has only one stage, providing heat transfer between the substrate, the temperature of which is close to the melting temperature $T_A$ of the lower melting component of the two-phase mixture, and the exit temperature $T_L$ of the cooling liquid or fluid, circulating in the housing supporting substrate base, Thus $R_1 \sim (T_A-T_L)/Q$, where Q is the heat flux measured in watts per $cm^2$, (w·$cm^{-2}$), and $R_1$ has dimensions $cm^2 \cdot °C./w$. For example, when Q=100 w·$cm^{-2}$, and ($T_A-T_L$) is 500° C., the value of the thermal resistance $R_1$ is close to 5 $cm^2 \cdot °C./w$.

Figure 2:
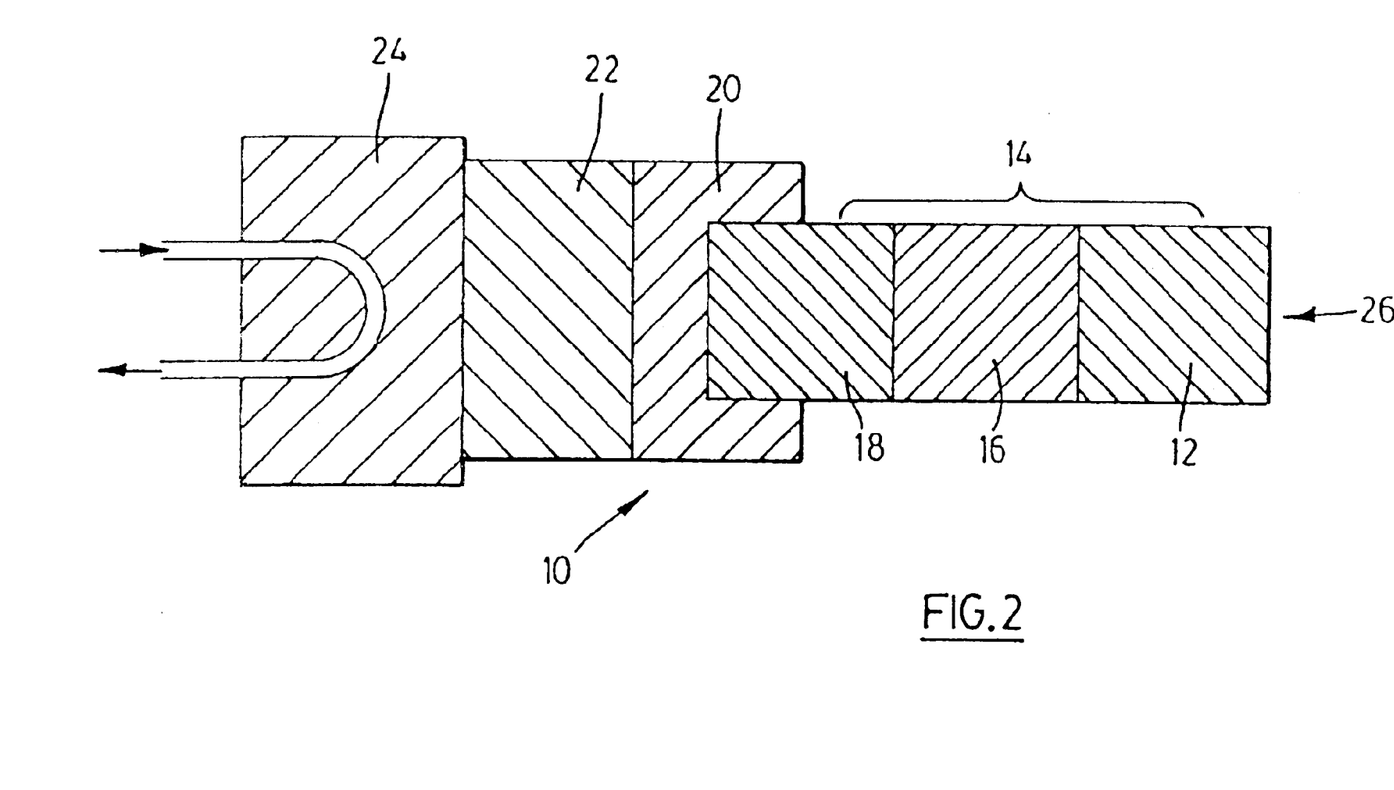
FIG. 2 is a schematic representation of a substrate holder assembly according to the present invention, including the heat transfer regulating composite mixture, and a multi-staged heat sink.

In more complex designs, the substrate base and the housing incorporating the base, may be supported on another metal block incorporating circulating oil or a similar cooling fluid, thus providing the second stage of a conventional heat sink arrangement, having a second thermal resistance, $R_2$. The last stage of the heat sink is frequently, however, not necessarily, another conventional water cooled metal structure, providing yet another thermal resistance $R_3$. Thus the heat sink channels the heat transferred through several stages of thermal resistance to the ambient temperature in a conventional manner. A schematic representation of the preferred embodiment of the present invention is shown on FIG. 2. An assembly 10, utilized in a vapour deposition process contains an elongated substrate body 14, having a depositing surface 12, which is immersed in a high temperature atmosphere 26, containing the species to be deposited. A stem 18, of the substrate 14 is held in a substrate mount or substrate holder 20, which is in contact with or is supported on a substrate mount base 22. The supporting base 22, and the substrate mount 20, may constitute a single entity or may be separate units. The assembly has a water cooled base 24, in direct contact with ambient temperature. The substrate stem 18 is surrounded by a composite two-phase mixture 16, composed of a low melting metal A, of melting point $T_A$, and a particulate ceramic material B, non-wetted by A, having melting point $T_B$ well in excess of the depositing temperature $T_D$. In the instance of diamond deposition, the atmosphere in which the substrate is immersed, is a plasma bearing ionised carbon. A convenient plasma composition for diamond deposition is a mixture of methane gas and an inert gas, such as argon. When the vapour deposited layer attains a desired thickness the substrate is removed from the vapour bearing atmosphere, or in this particular process, from the ionised carbon containing plasma, and a fresh substrate is placed in the depositing chamber.

The metal in the two-component mixture can be tin, lead, aluminum, indium, gallium, copper-silver alloy, and an alloy of these metals, or any other similar low melting metal or alloy which is not affected by the surrounding atmosphere. The particle size of the metal before melting is not critical, but to ensure good mixing the particle size of the metal powder is preferably between 1 and 10 $\mu$m. As has been mentioned above, the particulate ceramic may be one or a mixture of alumina, silica, titanium nitride, titanium carbide, titanium carbonitride, boron carbide, boron nitride or materials which have high melting temperature, are oxidation resistant, are also relatively good heat conductors and are not wetted by the metal in combination with they are used. The average particle size is dictated by convenience and is usually less than 1 $\mu$m.

The composition and the ratio of the low melting metal or alloy component to the ceramic component in the two-phase mixture is determined by the nature of the deposited coating, the desired coating thickness, the ultimate purpose of the vapour deposition process, the size of the substrate, the temperature of the vapour depositing reaction and similar process considerations. The convenient ratio in weight, of the low melting metal or alloy to the ceramic particles ranges between 10:90 and 80:20.

The pre-treatment of the depositing surface of the substrate can include usual process steps such as grinding, polishing, cleaning, preheating, etching, ion cleaning, ion nitrating, coating with a non-reactive layer, priming of the surface and treatment by radiation.

Figure 3A:
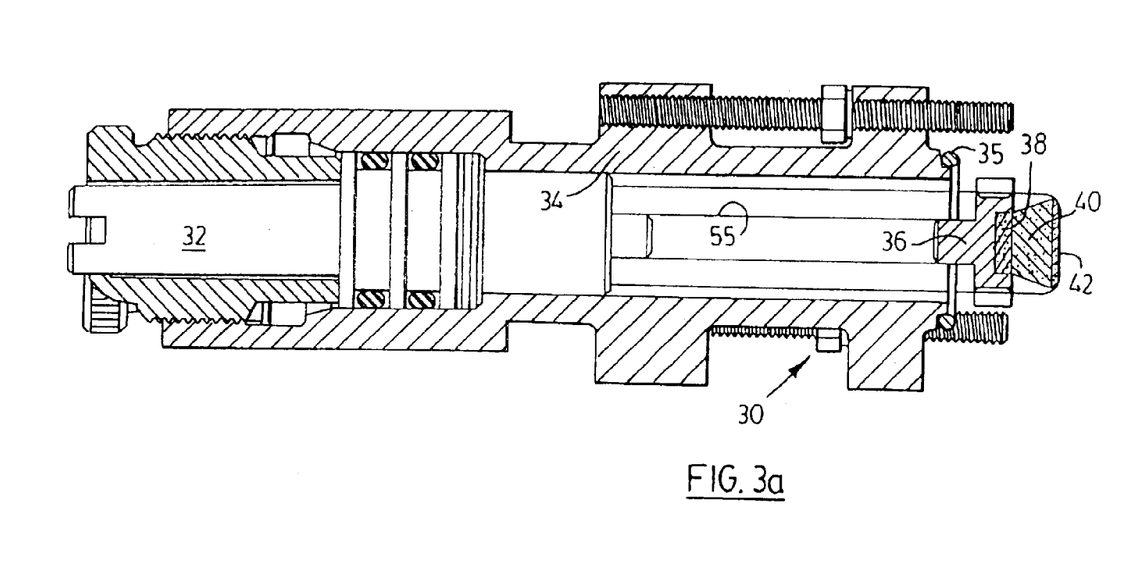
FIGS. 3a and 3b are horizontal and cross-sectional views, respectively, illustrating a single substrate holder arrangement according to the present invention.
Figure 3B:
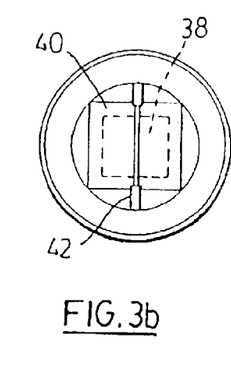

A single substrate holder assembly and its cross-section at the substrate stem level is illustrated in FIGS. 3a and 3b. The substrate carrying assembly 30, has a substrate holder base 32, a housing 34, a substrate holder O-ring 35, a substrate mount 36, which is designed to hold a substrate 40, and a two-phase composite mixture 38 of the present invention. The substrate 40, having a depositing surface 42, is held in contact with the two-phase mixture 38, within the mount 36. A substrate mount support 55, is a metal tubing which supports substrate mount 36, and also serves as a means to transfer heat energy to the various heat sink stages. The cross-section of the substrate mount 36 is shown in FIG. 3b, where like items are indicated by like reference numerals.

Figure 4A:
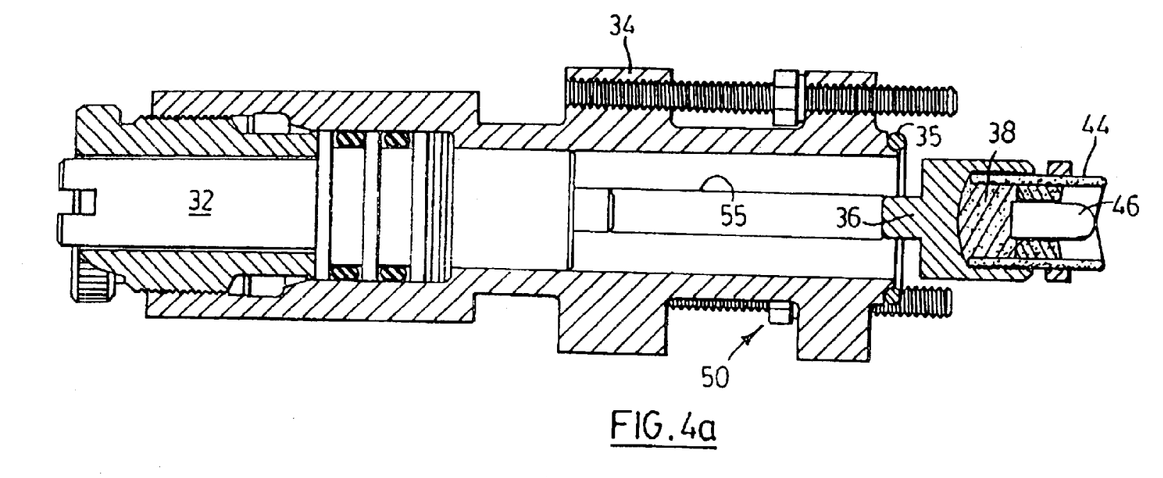
FIG. 4a and FIG. 4b are horizontal and cross-sectional views, respectively, of a multi-substrate holder arrangement according to the present invention.
Figure 4B:
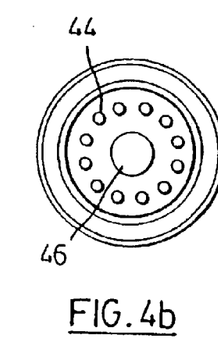

A multi-substrate holder 50 is shown in FIG. 4a, and its cross-sectional view in FIG. 4b. The multi-substrate holder assembly 50, has components similar to the single substrate holder assembly 30, of FIG. 3a, indicated by reference numerals 32, 34, 35, 36, and 55. The two-phase mixture 38 in this case is in contact with a plurality of substrate stems 44, arranged in a circle around a mount seal 46. A cross-sectional view of the substrate mount 36, having substrate stems 44 in a circular formation, packed with the two-phase mixture 38, and held in position by the mount seal 46, is shown in FIG. 4b.

The plasma gas in the vapour depositing processes utilizing the two phase composite mixtures for regulating the temperature of the vapour deposition may include one or more of nitrogen, methane and similar short chained hydrocarbon, oxygen, hydrogen, water, inert gases, and vaporized metal.

EXAMPLE 1

Metal rods of 2 mm diameter, made of tungsten alloyed with 2 wt % lanthanum, were cut into 19 mm lengths, to be made into dental drills by coating each 19 mm rod with a layer of vapour deposited polycrystalline diamond. The metal drill substrates to be coated were first mechanically polished by sandblasting with silicon carbide of 100 $\mu$m size, cleaned ultrasonically in an acetone bath, and then the surface to be coated was primed by dipping into a isopropyl alcohol suspension of submicron sized diamonds to provide seeding.

Composite mixtures were made of fine tin of particle size 1–5 $\mu$m and boron nitride having particle size less than 1 $\mu$m. The tin content of the composite mixtures were as follows: 20%, 40% and 80%, and an additional test with no tin added.

Twelve (12) pretreated drill substrates for vapour deposition were placed in a multi-substrate holder 36, as shown in FIG. 4, packed with one of the above tin-boron nitride composite mixtures for controlling and regulating thermal energy transfer, and the drills surrounded by the composite mixture were held in position by the mount seal 46. The substrate holder with 12 drills, was subsequently placed in an arc assisted CVD reactor, such as for example, described in U.S. Pat. No. 5,587,207, to be coated with vapour deposited, polycrystalline diamond coating. The gas in the reactor was composed of argon, hydrogen and methane in a ratio: $Ar:H_2:CH_4=2000:500:4$. The temperature of the substrate holder during vapour deposition was measured by means of a precision thermocouple brazed to one of the drills held in the substrate holder. The power flux proceeding from the arc plasma column towards the substrate surfaces was 10 watt.cm$^{-2}$. The duration of each diamond coating deposition utilizing two phase composite mixtures of different tin content was 12 hours.

Figure 5:
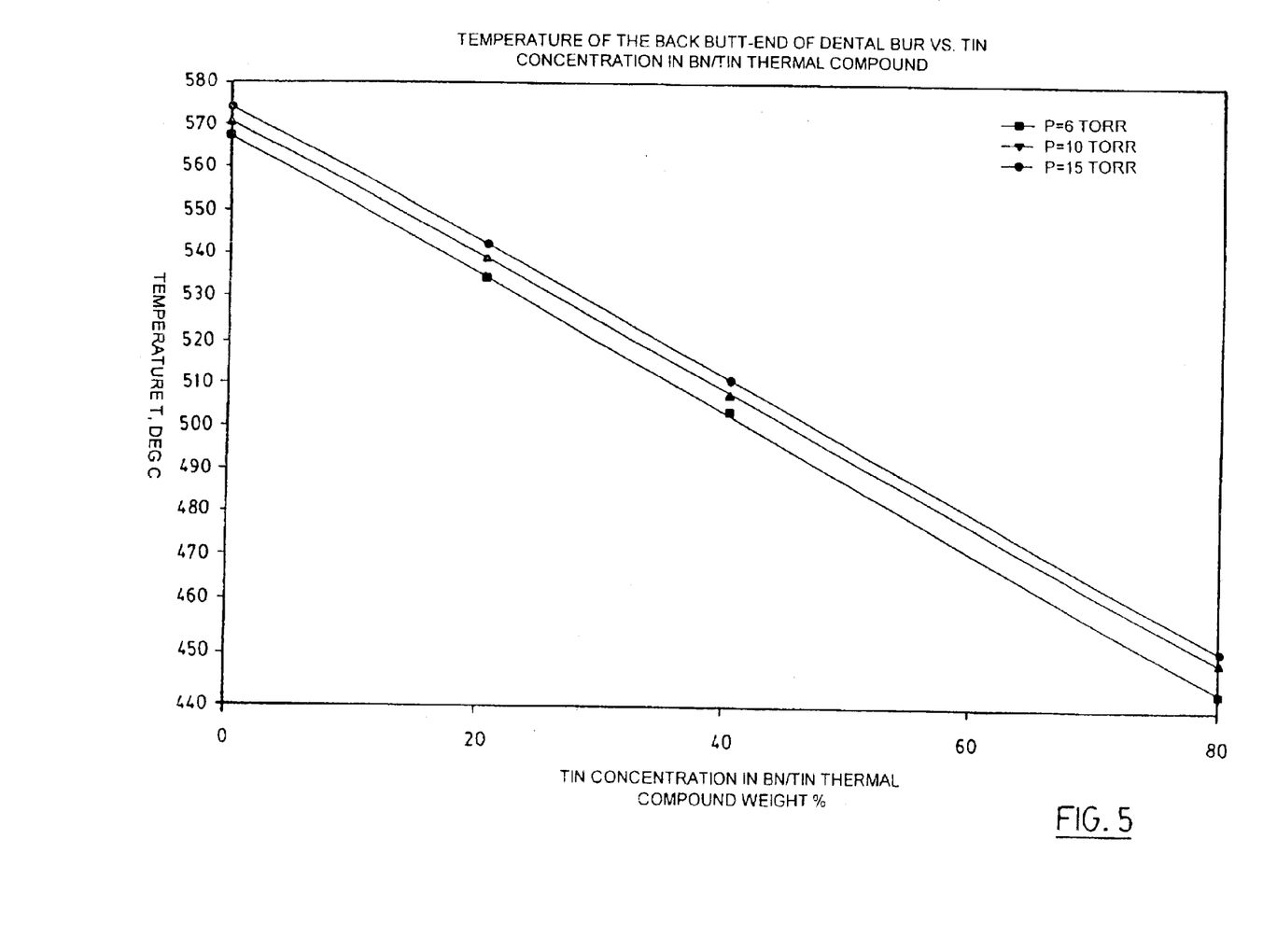
FIG. 5 is a graph illustrating the effect of the composition of a two-phase mixture of the present invention, on the temperature of a substrate used in a vapour deposition process.

The temperature of the substrate holder during the vapour deposition process was plotted against the tin content of the two phase mixture surrounding the drills, starting with pure boron nitride powder. The results are shown on FIG. 5. It is noted, that in the absence of tin in the thermal energy transfer regulating substance high but rapidly fluctuating temperatures were observed, and the diamond coating obtained was uneven, having irregular crystallite sizes. Another variable tested in the above vapour deposition process having controlled and regulated thermal energy transfer means, was the pressure within the depositing chamber. However, as it can be seen, variations in the pressure between 6 and 15 torr had no effect on the substrate holder temperature. The quality and morphology of the coating obtained was examined by scanning election microscopy (SEM). It was found that a two phase composite mixture containing 20% tin and boron nitride provided the optimum conditions for obtaining uniform polycrystalline coating of even sized diamonds at a high deposition rate of 3 μm per hour.

EXAMPLE 2

A sintered tungsten carbide-6% cobalt containing insert of 3 mm height and having a 10 mm by 10 mm square face to be coated with diamond coating, was placed in a single substrate holder assembly shown on FIG. 3. The surface of the carbide insert was pretreated by SiC sandblasting and ultrasonic cleaning as described in Example 1, then etched in a solution of 1:1 HCl—$H_2SO_4$, followed by seeding in a submicron sized diamond suspension in isopropyl alcohol. The pre-treated carbide inserts were individually coated utilizing different tin-boron nitride mixtures as the thermal energy transfer regulating two phase composition. The temperature of the substrate was measured by a thermocouple attached to the underside of the sintered carbide insert. The thermal energy transfer regulating two phase BN-tin compositions included 20% and 40% tin, as well as boron nitride without tin addition for comparison. The size of the boron nitride particles was less than 1 μm, and the admixed fine tin had particle size ranging between 1 μm and 5 μm. The diamond coating was obtained in a CVD apparatus, and under conditions similar to that described in Example 1. It was found that using boron nitride powder only as thermal energy transfer regulating packing, resulted in irregular substrate temperatures, and no or only very poor quality diamond coatings could be obtained. Polycrystalline diamond coatings of desired quality, composed of even sized diamond crystallites of 20–30 μm, were obtained with 40% tin containing BN-tin mixtures as the two phase compositions. The average rate of diamond deposition under such conditions was 3.5 μm per hour.

EXAMPLE 3

Razor blades coated with a "diamond-like-carbon" coating were obtained by a vapour depositing process referred to as DLC coating process. The diamond-like-carbon coatings were produced in an apparatus utilizing filtered plasma arc and operated at $10^{-5}$ torr pressure. The steel blades to be coated were attached to the surface of a well polished, massive block of aluminum. The aluminum block was water cooled. To obtain uniform DLC coating it was essential that the thermal energy generated by vapour deposition was transferred in a regulated manner by a thermally conductive composition. One face of the thin steel blades was in contact with the aluminum block by means of a thin layer of a two phase composition containing 40% gallium of particle size 45 to 60 μm, in a Ga—BN mixture. The Ga—BN mixture was first suspended in iso-propyl alcohol and painted on the surface of the aluminum block to form a coating under the thin steel blades prior to applying vapour deposition. The nano-hardness of the DLC coating obtained using the two-phase Ga—BN mixture as thermal energy transfer regulating medium, was measured to be 60 GPa. In comparison, vapour deposited DLC coatings on steel razor blades were obtained without the utilization of thermal energy transfer regulating compositions of the present invention. The resulting coatings were uneven and when tested exhibited substantially lower nano-hardness.

The above examples describe the utilization of two phase mixtures of low melting metal-ceramic particles in processes for obtaining diamond or diamond-like-carbon coatings. The thermal energy transfer regulating mixtures may be used in other processes, chemical or physical, for obtaining vapour deposited coatings of even grain size and thickness. It will also be apparent that the method of regulating thermal energy transfer described herein can be applied to many other types of processes for obtaining vapour deposited coating beyond the examples given, for instance, coatings of ceramic materials, such as tungsten carbide, and other hard wearing ceramic materials on hard metal surfaces deposited at elevated temperatures. The operational parameters, such as the temperature difference between the deposition and the substrate base, composition of the two phase mixture, gas composition bearing the vapour to be deposited, vapour pressure of the depositing species etc. are adjusted according to the desired coating.

The method of regulating heat and energy transfer by utilizing a two phase mixture of high melting point ceramic particles and a low melting point metal can be applied in manufacturing processes in fields other than vapor deposition, such as the manufacture and use of cooking utensils or pots, tube furnaces and thermal barrier shield for jets and rockets as described below. It can also be utilized in such other applications as sintering by powder metallurgy, heat treatment and ion nitrating, for heat sink devices in electronics, thermal insulation in building construction, food processing, thermal regulating in biological environments and in medical applications.

EXAMPLE 4

Cooking pots or similar utensils, made of stainless steel or other suitable metals and having convenient size and volume can be manufactured utilizing the heat transfer regulating mixture of the present invention. It is a known practice to have a stainless steel flat bottomed container equipped with a heavy, relatively high heat capacity copper or stainless steel plate. In conventional cooking pots the plate has a rim adapted to smoothly enclose the circumference of the container and attached to the flat bottom of the container by means of high temperature soldering, brazing or similar conventional methods. The role of the heavy copper or stainless steel plate is to ensure even and rapid heat transfer from an electrically heated hot plate or cooking ring or a gas-burning device, in a normal cooking or household heating operation. One of the shortcomings of such a conventionally attached plate to the bottom of the container is that it allows relatively rapid heat loss, in other words, the contents of the container, e.g. the food cooked, will cool rapidly which may be undesirable.

Figure 6:
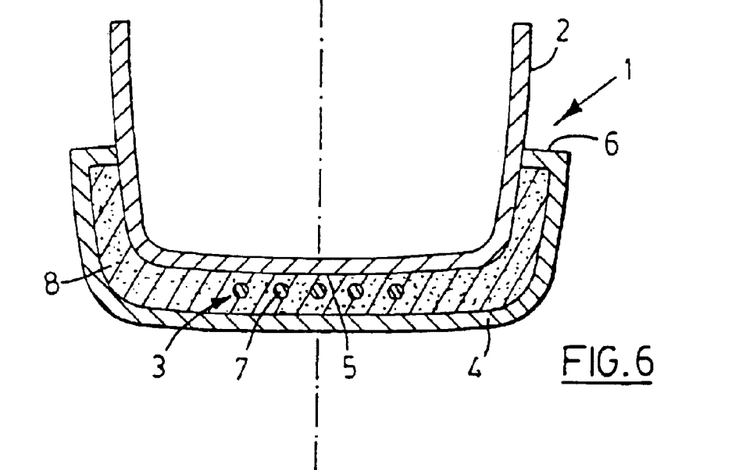
FIG. 6 is a schematic representation of fry pan with bottom cavity filled with thermal regulating composite mixture according to the present invention.

FIG. 6 shows schematically a cooking utensil or pot 1, made of conventional parts, that is a stainless steel container 2, having a flat bottom section 5, tightly fitting into a heavy gauge stainless steel base cap 4, having a rim 6, adapted to enclose the container 2. A cavity 3 is defined between the container 2, and rimmed base cap 4, is filled with a composite mixture 8, according to the present invention, having the following composition: 40 wt % indium powder, of −325 mesh (less than 40 μm) size, thoroughly mixed with 60 wt % boron nitride ceramic powder of 5 μm particle size. When placed on a gas ring or conventional hot plate of a stove, the three component cooking pot 1, can be used as a cooking utensil in the usual manner. At the melting temperature of indium, 156° C., the composite mixture becomes a two phase semi-solid mixture with excellent heat conducting or heat transferring properties ensuring rapid heating of the contents of the vessel.

When a heating process using the cooking pot 1 shown on FIG. 6, is terminated, that is the contents of the cooking pot have been maintained at the prerequisite temperature for a prerequisite period of time, the heat is turned off, resulting in the gradual cooling of the cooking pot and its contents. When the temperature inside cavity 3, drops below the melting point of indium, the liquid indium solidifies, the ceramic powder becomes dispersed in the solidified metal, leading to a substantial slowing down in the rate of further heat transfer, that is the cooling of the contents of the vessel. In other words, the contents in the cooking pot can be kept warm longer.

In an other embodiment of the present invention a heater such as shown by representative heating elements 7 can be incorporated in the bottom of the cooking pot, surrounded by the thermal regulating composition 3.

EXAMPLE 5

Figure 7A:
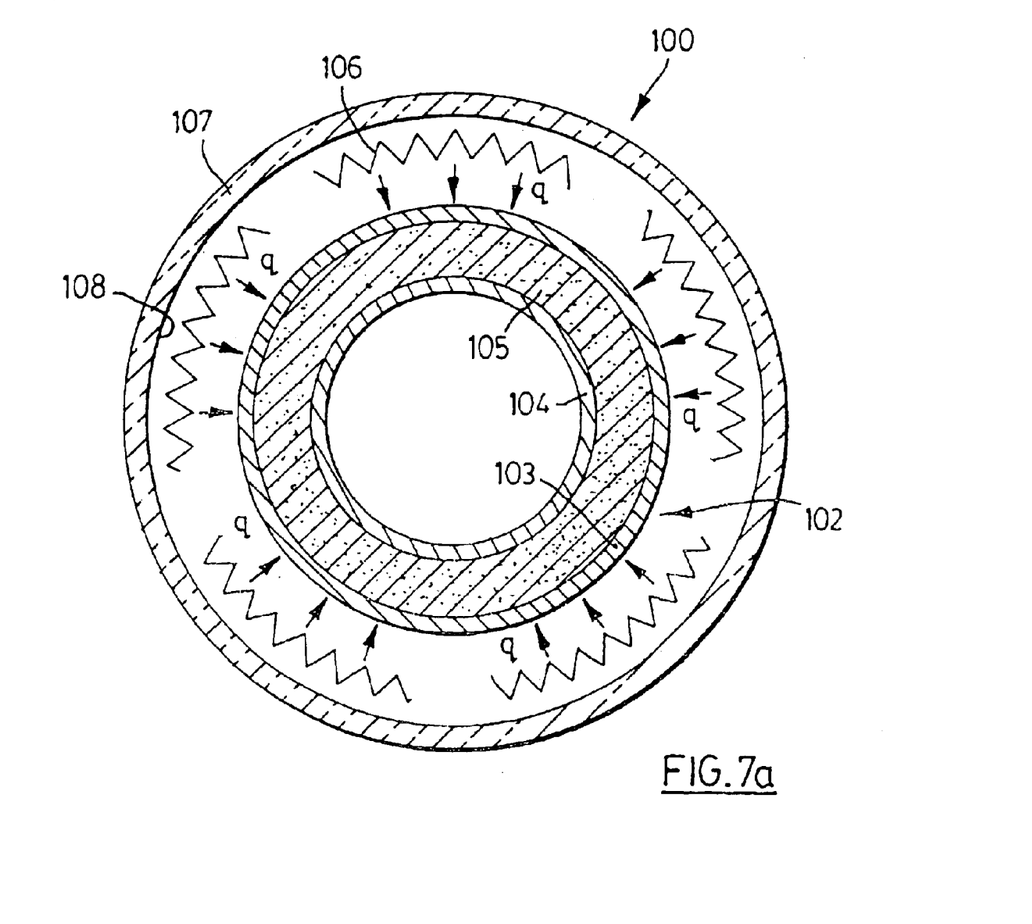
FIG. 7a is a sectional view through a tube furnace incorporating a heat transfer regulating mixture according to the present invention.
Figure 8:
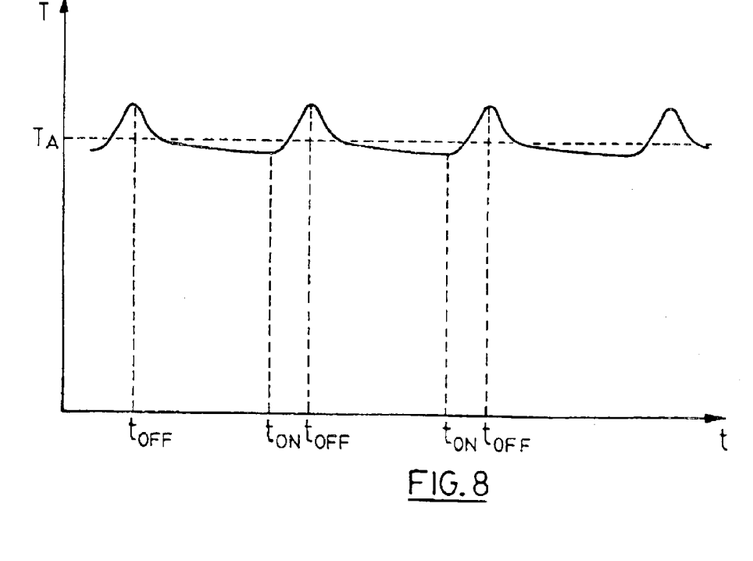
FIG. 8 is a graph illustrating temperature versus time characteristics of a tube furnace according to FIG. 7a or 7b.

Thermal regulating composition can be used as a thermal transfer medium for tube furnaces and related CVD reactors. A high temperature tube furnace 100 is schematically shown in FIG. 7a. It consists of a tubular furnace body 102, created by two tube liners, external liner 103 and internal liner 104. A thermal regulating composition 105 according to the present invention fills the space between the tubes 103 and 104. In this case the thermal regulating composition 105 consists of 20% weight of copper powder with particle size 3–5 $\mu$m as a component A having low melting point ($T_A$~1050° C.) and balance fine alumina powder with particle size 1–2 $\mu$m as a component B having a high melting point. The tubular body 102 is surrounded by a heating array 106, made of molybdenum and an external thermal insulating tube 107, having an internal reflecting surface 108. The molybdenum heaters 106 are heated by DC current, provided by a DC power supply (not shown). At a moment $t_{on}$ when the heaters are turned on, a thermal flux q is directed on the external surface of the tubular body 102. When the temperature of the thermal regulating composition exceeds the melting point of copper $T_A$, the copper will melt and the thermal resistivity of the tubular body 102 will drop down to the level determined by the low melting point component A. The temperature inside the furnace will increase rapidly to exceed the melting point of copper. If the heaters are turned off at a moment $t_{off}$, the temperature of the tubular body will decrease quickly below the melting point $T_A$. At that moment the copper will solidify and the thermal resistance of both the thermal regulating composition 5 and the entire tubular body 2 will increase to the level, determined by the ceramic component B. From this moment the temperature inside of the furnace will decrease very slowly due to the thermal insulating properties of the ceramic component B of the thermal regulating compound 5 as it is diagrammatically shown in FIG. 8. It can be seen that heat can easy propagate from the outside toward the inside space of the furnace throughout the furnace body 2 during the heating stage, while it keeps insulated and trapped during the cooling stage when the heating array 106 is turned off.

Figure 7B:
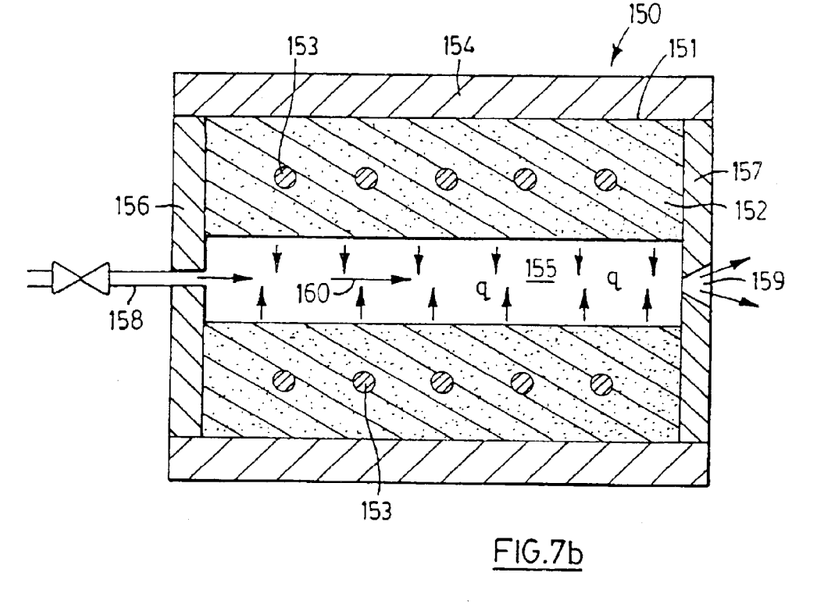
FIG. 7b is an axial sectional view of an alternate embodiment of a tube furnace incorporating a heat transfer regulating mixture according to the present invention.

In an other embodiment, and as shown in the axial section view of FIG. 7b, a heater array 153 can be incorporated in the body of a furnace 150, surrounded by a thermal regulating composition 152 for heating gas flow. In this case the furnace body consists of a tubular enclosure 151 filled with a thermal regulating composition 152. A conventional ceramic thermal insulation 154 surrounds outer surface of the furnace body 151. Both ends of the furnace are sealed by respective ceramic lids 156 and 157. The lid 157 has a discharge nozzle 159 and the lid 156 has an inlet pipe 158 for injecting a gas mixture 160 respective to be heated in the furnace 150.

EXAMPLE 6

Figure 9:
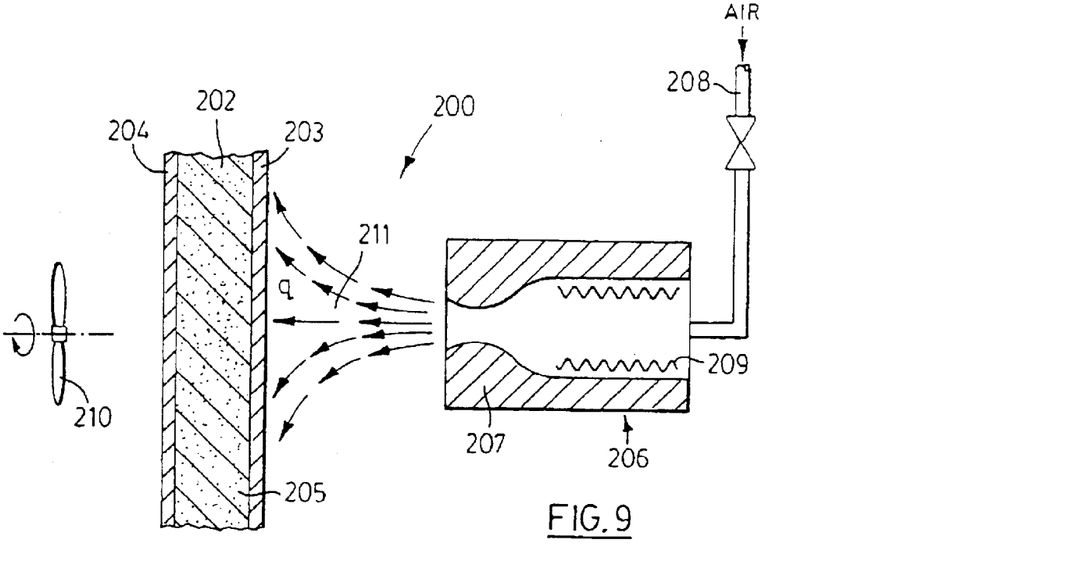
FIG. 9 is a schematic illustration of a thermally resistant shield plate according to the present invention for use as a thermal barrier shield against impact with high temperature atmospheric flow at supersonic velocities.

The thermal regulating composition can be successfully used as a thermal barrier shield against impact with high temperature atmospheric flow for supersonic jets and space rockets. The change in concentration of low melting point component A allows one to regulate the thermal resistance of the shield with a high degree of accuracy, as was shown above in FIG. 5 for the CVD processing of polycrystalline diamond coatings. An arrangement 200 for modeling thermal transfer between high temperature supersonic air plasma flow and a thermally resistant shield plate is schematically shown in FIG. 9. It consists of a flat shield-wall 202, having two parallel inconnel plates: a front plate 203 and a back plate 204. A thermal regulating mixture 205, having the same composition as in Example 5 fills the space between plates 203 and 204. A source 206 of a supersonic high temperature jet 211 is installed in front of the shield 202. It consists of a supersonic nozzle 207, a gas inlet 208 and a resistance heater 209 connected to a DC power supply (not shown). A back side of the shield is cooled by a forced convection means 210. When the supersonic high temperature jet 211 is directed on the shield 202 the temperature of the thermal compound increases and eventually reaches the melting point of the component A. At this moment the thermal resistance of the shield drops down to allow it to protect the front plate 3 against excessive thermal flux coming from the supersonic jet 211. When the oncoming thermal flux decreases, the low melting point component solidifies and thermal resistance of the shield 202 increases which keeps the temperature of the front plate 203 high providing preferable conditions for radiation cooling.

Figure 10:
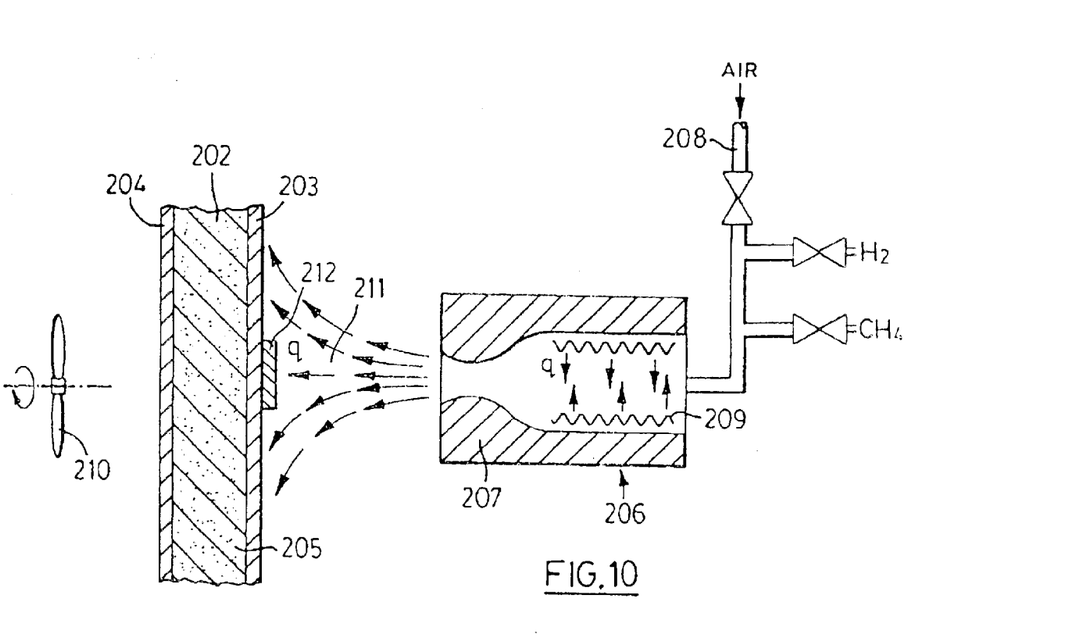
FIG. 10 is a schematic illustration similar to FIG. 9, but showing a substrate to be coated and placed near a stagnation point of high temperature supersonic plasma flow.

This arrangement can be also used as a supersonic jet assisted CVD reactor as shown in FIG. 10. In this case a carbide insert 212 as a substrate to be coated is placed near the stagnation point of high temperature supersonic plasma flow on the front surface of the shield 202. The plasma creating gas composition consists of argon (3 slm), hydrogen (0.5 slm) and methane (3 sccm). The thermal regulating composition 205, contains 1–5 $\mu$m size BN powder with a 3–5 $\mu$m size 20 weight % aluminum powder composition allows the temperature on the surface of the carbide insert 212 to be kept at 900° C. with an accuracy of +/–2%.

EXAMPLE 7

Figures 11, 12A:
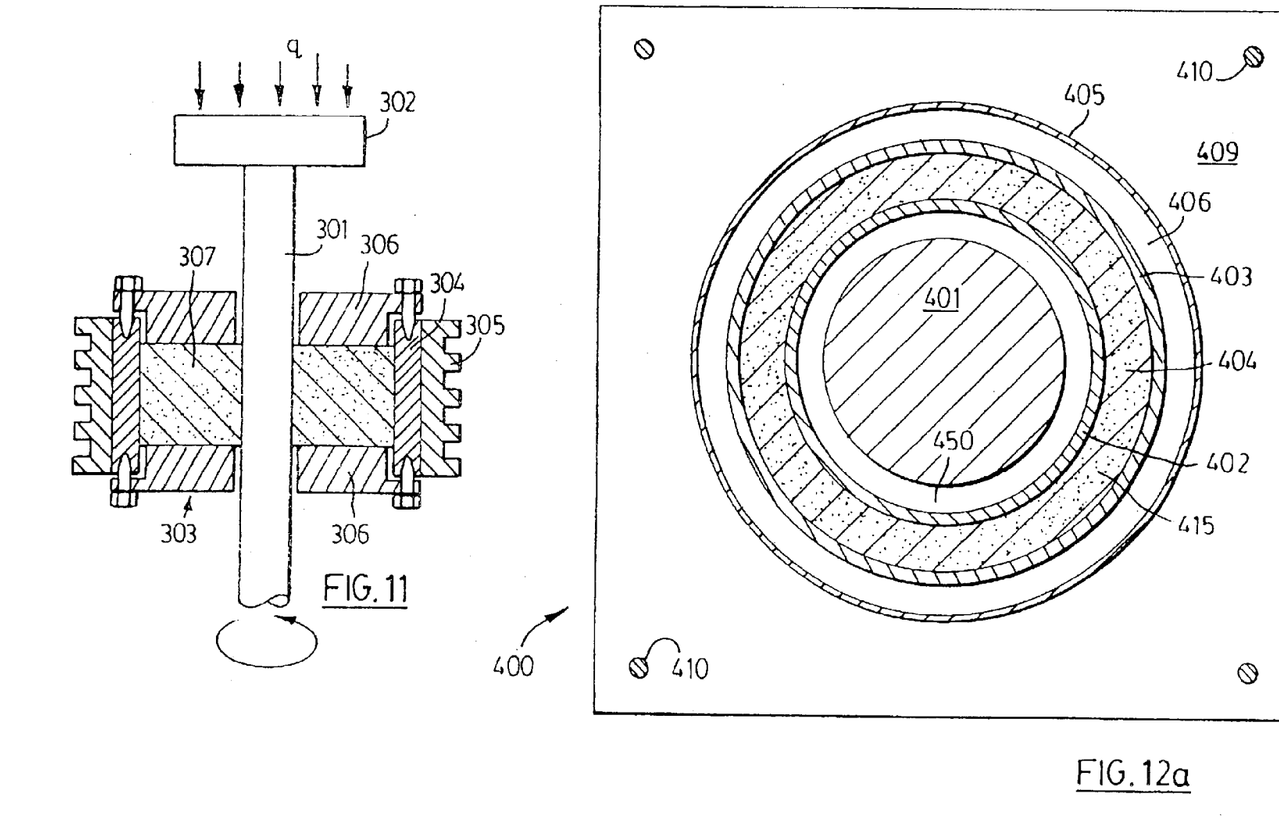

A two-phase thermal regulating composition according to the present invention can be used as a thermal regulating and support medium in a sliding bearing arrangement to support rotating parts exposed in a thermal transfer environment. FIG. 11 shows a rotating shaft 301 with a heat receiver 302 supported by a radial bearing 303, consisting of a cylindrical body 304 with external cooling ribs 305 made of steel and with two opposed graphite lids 306. The cavity created by the body 304 and the lids 306 is filled with a thermal regulating compound 307 having the same composition as in Example 1. The shaft 301 is rotated by a conventional motor (not shown). When the temperature of the shaft 301 exceeds the melting point of low melting point component of the thermal regulating compound 307 (tin) this component melts, providing an increase in the thermal conductivity in the vicinity of the shaft 301 and a simultaneous reduction in the friction between the shaft 301 and the surrounding thermal regulating composition 307.

Another application where heat and energy transfer can be regulated by utilizing a two phase mixture in a multi-stage heat sink arrangement is the incorporation of a heat transfer regulating mixture in enclosures for power generating devices. Some of the more recently developed power generating devices operate at high temperatures and require well regulated energy flux to the surroundings, but are often confined to relatively small spaces. Examples of such power generating devices include solid oxide fuel cells, systems with proton exchange membranes, phosphoric acid cells, and such like.

The moving species in a solid oxide electrolyte fuel cell is oxygen ions and in order to obtain sufficiently high current density the fuel cell is operated at temperatures close to 1000° C. The fuel cells are often designed for operating moving, electrically driven vehicles. For the most efficient utilization of the energy generated, as well as for the safety of the driver and the passengers, isolation and insulation of the fuel cell bearing enclosure, as well as the controlled transfer of heat generated, are of great importance.

It should be noted, that similar considerations can apply to catalytic converters of vehicles, or catalytic converters utilized in other areas, which normally operate at 300–600° C.

According to the present invention, a first stage of regulating the operating temperature of a high temperature fuel cell or similar high temperature installation, is to enclose or envelop the fuel cell in an enclosure containing a two-phase thermal energy flux regulating mixture. A second stage of the thermal flux regulating system can incorporate conventional convective or vacuum radiation heat sink methods. A final stage may be a conventional water cooling arrangement.

An embodiment of the invention which can be utilized in a fuel cell system for driving electric vehicles is shown in FIG. 12a, which is a schematic cross-section of a thermal flux regulating device according to the present invention generally indicated by reference 400 and houses a heat generating device 401. The heat generating device 401, in this instance a fuel cell running at high temperature, is enclosed in a space 450, provided within a tube or pipe 402. The tube or pipe 402 should to be made of a good heat conductor and be resistant to oxidation, such as for example, nickel based stainless steel. The tube or pipe 402 is located in a concentric pipe 403, to define an anular space 404 therebetween.

A two-phase heat energy transfer regulating mixture 415 as described above is packed into the space 404. As has been described in detail above, the two-phase mixture 415 is made up of a metal or alloy component A, that melts at close to the temperature at which the power generating device 401 works optimally, and a fine ceramic powder, usually a high melting, oxidation resistant ceramic oxide B, having low thermal conductivity. The heat energy transferred by the two-phase mixture is transmitted through the walls of pipe 403 into a further anular cavity 406, which is created around the tube or pipe 403 by another concentric tube or pipe 405. The cavity 406 represents a second stage of the heat energy transfer regulating system which is usually a conventional heat sink arrangement or device.

In the instance of a solid oxide electrolyte bearing fuel cell, the optimum operating temperature is above 800° C., preferably close to 1000° C. A convenient two-phase thermal energy transfer regulating mixture can be made of silver powder (melting temperature about 960° C., depending on impurities present) initially of a 1–5 μm particle size, and a fine powder of an appropriate non-melting ceramic oxide, such as for example, alumina or fine silica.

The rate of thermal energy flux may be further determined by the nature of the medium in the cavity 406, which may be a low pressure inert gas or a partial vacuum, with the thermal energy flux being transmitted there across by radiation. The tube or pipe 403 may be an oxidation resistant metal pipe having a highly polished external surface or may even be made of quartz having a very reflective surface facing the concentric tube or pipe 405, which may have a reflective internal surface. In other words, the cavity 406 located between the tube or pipe 403 and the tube or pipe 405 may be similar to the reflecting surfaces within a conventional vacuum insulating flask.

The heat generating device may also be a sodium/sulphur fuel cell, or a phosphoric acid cell, or the device requiring a thermal energy flux regulator may be a catalytic converter, and the heat sink in such cases needs to be operated at 300–400° C. The cavity 406 in such an instance may contain tin, or an alloy which is molten at that temperature range, or a modified hydrocarbon which does not degrade at the above temperature range. Preferably, the cylindrical cavity 406 can be sealed and thereby the material located therein, selected to be in a liquid physical state in the desired temperature range, can be protected from oxidation and/or loss by evaporation or spillage.

Optionally, a second heat sink may be provided for the thermal energy regulating device for high temperature installations, by brazing a coil to the external surface of pipe 405 for circulating cooling water.

Figure 12B:
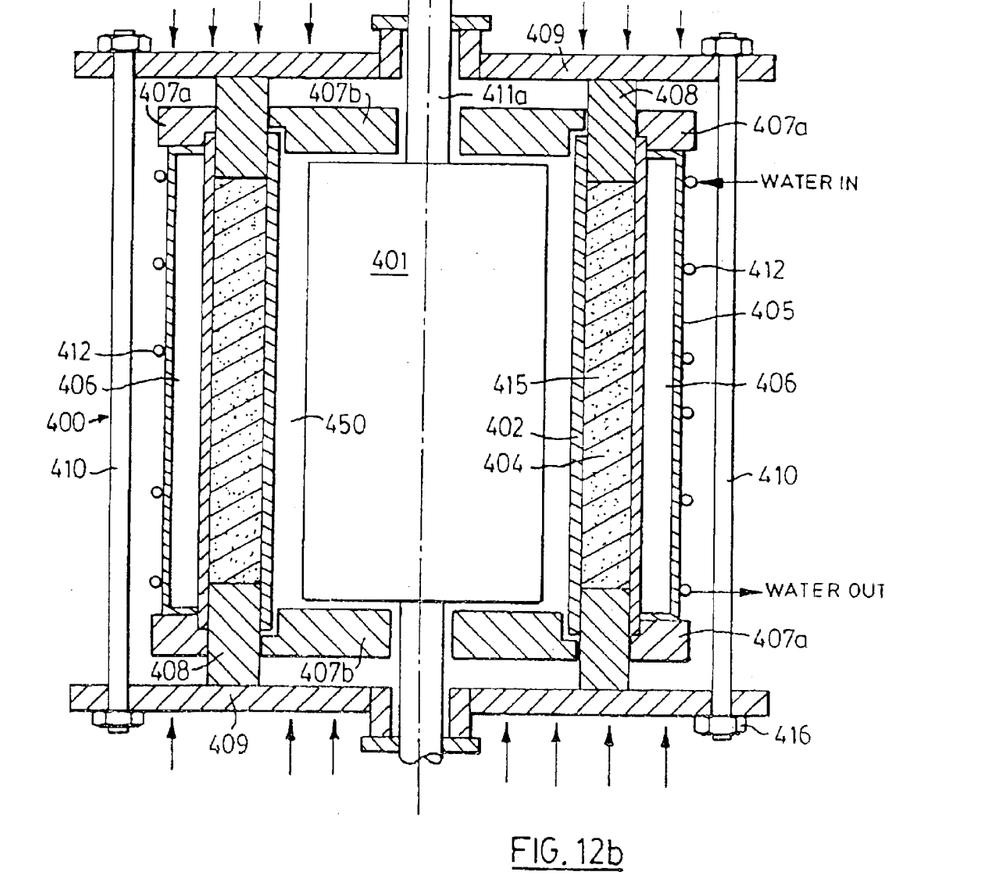
FIG. 12b is a perspective view, respectively, illustrating the use of a thermal regulating compound according to the present invention as a variable conductance insulation of an enclosure containing solid oxide fuel cell or other power generating devices.

A perspective view of the thermal energy flux regulating device for high temperature installations is shown on FIG. 12b, where like reference numerals represent like items.

An important feature of the thermal flux regulating device 400 incorporating the two-phase heat energy transfer regulating mixture 415 of the present invention is shown in FIG. 12b, and consists of two ceramic rings 408 which are utilized for sealing and compressing the heat transfer regulating mixture 415 located in the cavity 404 between the tubes or pipes 402 and 403. The ceramic rings 408 are capable of adjustable displacement and thereby keep the mixture in cavity 404 under compression. A representative arrangement is shown whereby base plates 409 mounted outboard of the rings 408 are connected by connecting rods 410. Nuts 416 threadedly engage the connecting rods 410 to adjust the position of the base plates 409 to in turn cause the rings 408 to exert the desired compressive force on the mixture 415.

In the foregoing the advantages of regulating heat energy transfer by utilization of a two-phase composition made up of a component having melting point close to the temperature of the operation to be controlled, mixed with another component of fine particle size and melting temperature well in excess of the temperature of the operation, have been described and supported by examples. The heat energy transferred by the above two-phase composition may subsequently be removed in one or more heat sink stages of conventional design. It should be noted that it is possible to utilize another appropriate two-phase composition (having a lower melting point of the low melting point component) replacing one or more of the conventional heat sink stages.

It will be appreciated that the mixture of the ceramic and metal powders in the thermal regulating composition should not segregate upon melting of the metal component. Accordingly, the amount of the metal powder should not exceed the void space between the individual particles making up the ceramic powder so that the ceramic powder in effect forms a "matrix" or a "skeleton" for containing the metal component. If more metal were used, the metal may withdraw to one part of the chamber within which it is contained with the ceramic powder withdrawing to another part of the chamber.

It will further be appreciated that, as is typical of powders, there will generally be a portion of the available void space which is not filled with the metal powder and which may be filled with a gas or evacuated to provide at least a partial vacuum. This provides a vehicle for "fine tuning" the thermal conductivity of the thermal regulating composition. For example using different gases to fill the void space will yield different resultant thermal conductivities as will different gas pressures. Gas pressure may be predetermined or varied in situ depending on design parameters. Furthermore, applying pressure to the thermal regulating mixture, as described above, will vary both the gas pressure and the size of the voids, hence affecting physical parameters of the system such as the proportionate contact area between the metal and the ceramic powder.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the spirit or scope of the present invention as defined by the following claims.

I claim:

1. A thermal flux regulator for a heated reactor, said regulator comprising: a reactor chamber for housing said reactor and a first beat regulating chamber surrounding said reactor chamber, said first heat regulating chamber containing a first heat transfer regulating mixture having a metallic component A having a melting point $T_A$ and a particulate component B which is non-wettable by the metallic component A, non-reactive therewith and has a melting temperature $T_B$ which is a higher than both the temperature $T_A$ and a first desired operating temperature $T_{D1}$ which is also higher than $T_A$.

2. A thermal flux regulator as claimed in claim 1 further having: a second heat regulating chamber disposed outwardly of said first heat regulating chamber, said second heat regulating chamber containing at least one of a liquid, a gas, a partial vacuum, a solid and a second heat transfer regulating mixture.

3. A thermal flux regulator as claimed in claim 2 wherein: said second heat regulating chamber is filled with a second heat transfer regulating mixture which contains a metallic component X having a melting point $T_X$ which is lower that $T_A$ and a particulate component Y non-wettable by said metallic component X and having a melting point $T_Y$ which is higher than both $T_X$ and a second desired operating temperature $T_{D2}$.

4. A thermal flux regulator as claimed in claim 3 wherein said second heat regulating chamber is surrounded by a heat sink comprising at least one of fins and a cooling coil.

5. A thermal flux regulator as claimed in claim 2 wherein said second heat regulating chamber is surrounded by a heat sink comprising at least one of fins and a cooling coil.

6. A thermal flux regulator as claimed in claim 2 wherein: said second heat regulating chamber has inner walls coated with a reflective material.

7. A thermal flux regulator as claimed in claim 1 wherein said first heat regulating chamber is surrounded by a heat sink comprising at least one of fins and a cooling coil.

8. A thermal flux regulator as claimed in claim 1, 2, 3, 7, 5 or 4 wherein: said first heat regulating chamber includes a volume adjuster acting between said first chamber and said first heat transfer regulating mixture to apply a compressive force to said heat transfer regulating mixture.

9. A thermal flux regulator as claimed in claim 8 wherein: said first heat regulating chamber is defined by inner and outer tubular members capped at at least one end thereof by a sealing member which sealingly and slidably engages said inner and outer tubular members as part of said volume adjuster.

10. A thermal flux regulator as claimed in claim 9 wherein: opposite ends of said heat regulating chamber are capped with respective end caps of a heat insulating material; and, at least one of said end caps is provided with an access opening for providing access to said reactor.

11. A thermal flux regulator as claimed in claim 8 wherein: said first heat regulating chamber is defined between inner and outer tubular members capped at opposite ends by respective sealing members which slidably and sealingly engage said inner and outer tubular members; a pair of platens clampingly engaging said sealing members to urge said sealing members into said first chamber; and, biasing members operably connected to said platens for applying a clamping force to said platens, said clamping force being transmitted to said sealing members by said platens and by said sealing rings to said heat transfer regulating mixture as said compressive force.

12. A thermal flux regulator as claimed in claim 11 wherein: opposite ends of said heat regulating chamber are capped with a respective end cap of a heat insulating material; and at least one of said end caps is provided with an access opening for providing access to said reactor.

* * * * *